(12) United States Patent
Garvey et al.

(10) Patent No.: US 6,613,198 B2
(45) Date of Patent: Sep. 2, 2003

(54) PULSED ARC MOLECULAR BEAM PROCESS

(76) Inventors: James F. Garvey, 8195 Golden Oak Cir., Williamsville, NY (US) 14221; Gary S. Tompa, 43 Franklin Dr., Bell Mead, NJ (US) 08502; Stuart G. MacDonald, 4663 E. Lake Rd., Pultneyville, NY (US) 14538

( * ) Notice: Subject to any disclaimer, the term of this patent is extended or adjusted under 35 U.S.C. 154(b) by 63 days.

(21) Appl. No.: 10/058,362

(22) Filed: Jan. 28, 2002

(65) Prior Publication Data

US 2003/0029735 A1 Feb. 13, 2003

Related U.S. Application Data

(60) Provisional application No. 60/284,226, filed on Apr. 18, 2001.

(51) Int. Cl.$^7$ ............................................. B01J 19/08
(52) U.S. Cl. ............................ 204/173; 423/445 B
(58) Field of Search ....................... 204/173; 423/445 B

(56) References Cited

U.S. PATENT DOCUMENTS

| | | | | |
|---|---|---|---|---|
| 6,063,243 A | * | 5/2000 | Zettl et al. ................... | 204/173 |
| 6,221,330 B1 | | 4/2001 | Moy et al. | |
| 6,261,424 B1 | | 7/2001 | Goncharenko et al. | |
| 6,277,318 B1 | | 8/2001 | Bower et al. | |
| 6,455,021 B1 | * | 9/2002 | Saito ........................... | 204/173 |

OTHER PUBLICATIONS

Shalev, Ed.; Moskovits, Ed., "Nanostructured Materials; Clusters, Composites, and Thin Films," ACS Symposium Series 679, ACS (Washington, DC; US), (Apr. 25, 1997) pp 183–197.

Rexer; Wilbur; Mills; Deleon; Garvey, "Production of metal oxide thin fims by pulsed arc molecular," Review of Scientific Instruments, American Institute of Physics (US), vol. 71 (No. 2), p. 2125–2130, (Apr. 25, 2000).

Sugai; Omote; Bandow; Tanaka; Shinohara, "Production of fullerenes and single–wall carbn nanotubes by high–temperature pulsed arc discharge" Journal of Chemical Physics, vol. 112, 6000, 2000.

Cheung; Kurtz; Park; Lieber, "Diameter–Controlled Sythesis of Carbon Nanotubes," J. Phys. Chem. B, ACS (Washington, DC, US), p. 2429–2433, (Apr. 25, 2002).

Wijekoon; Stry; Prasad; Garvey, "On the Nature of Thin Films Generated during the Laser Assisted Molecular Beam Deposition of Metal Plasma and Organic Vapors," Langmuir; the ACS Journal of Surfaces and Colloids, ACS (Washington, DC, US), vol. 12 (No. 20), p. 4929–4933, (Apr. 25, 1996).

* cited by examiner

Primary Examiner—Kishor Mayekar
(74) Attorney, Agent, or Firm—Howard J. Greenwald P.C.

(57) ABSTRACT

A process for preparing a material in which a gas mixture is subjected to a a temperature of at least 1,000 degrees Celsius while its pressure increased to at least 1,000 Torr. The pressurized hot gas mixture, which contains inert gas and fullerene ions, is then quenched by decreasing its temperature to a temperature of less than 500 degrees Celsius in a period of less than about 1 millisecond, and by decreasing its pressure of to a pressure of less than about 1 Torr in a period of less than about 10 milliseconds.

20 Claims, 5 Drawing Sheets

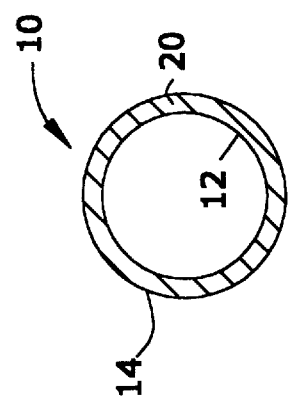
FIG. 2
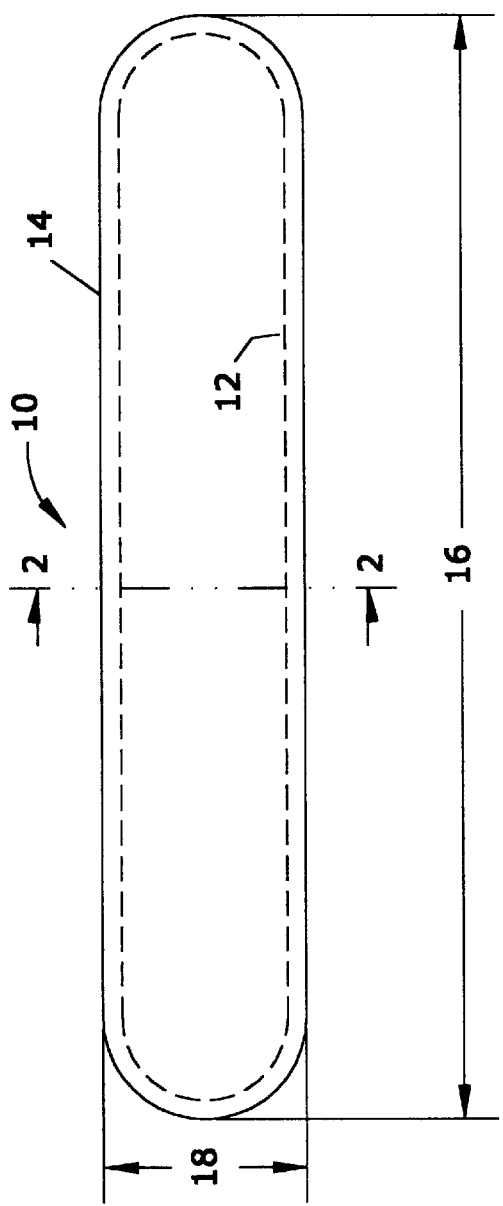
FIG. 1
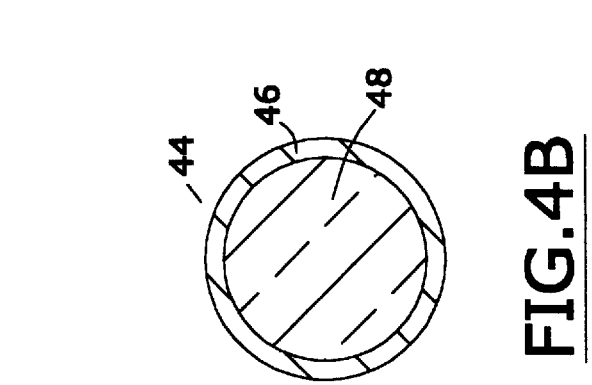
FIG. 4A
FIG. 4B
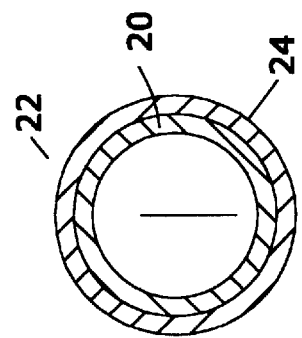
FIG. 3

PULSED ARC MOLECULAR BEAM PROCESS

CROSS-REFERENCE TO RELATED PATENT APPLICATION

This application claims priority based upon applicants' provisional application No. 60/284,226, filed on Apr. 18, 2001.

FIELD OF THE INVENTION

A process for making single-wall carbon nanotubes with a pulsed arc molecular beam deposition process.

BACKGROUND OF THE INVENTION

A substantial amount of work has been done regarding the generation of and properties of single-walled nanotube structures. Thus, by way of illustration, in article by T. Sugai et al. appearing in the Journal of Chemical Physics, Volume 112, 6000 (2000), a process was disclosed in which single-walled and multi-walled carbon nanotubes were produced by thermally heating fullerenes in the presence of a nickel catalyst. In the process of this article, non-uniform results were often obtained from experiment to experiment, and poor yields of the single-walled nanotubes were obtained. Additionally, to the extent that single-walled nanotubes were produced, they were often contaminated with metal catalyst.

To the best of applicants' knowledge, the prior art does not provide a process for high volume production of a pristine, single-walled carbon nanotubes which is reliable and reproducible. It is an object of this invention to provide such a process.

SUMMARY OF THE INVENTION

In accordance with this process, there is provided a process for making a substantially pure single-walled carbon nanotube comprising the steps of subjecting fullerenes to a temperature of at least about 10,000 degrees Celsius to produce gaseous fullerenes and gaseous fullerene fragments, and contacting said gaseous fullerenes and gaseous fullerene fragments with a gaseous hydrocarbon feedstock and gaseous metal-containing catalyst.

BRIEF DESCRIPTION OF THE DRAWINGS

The invention will be described by reference to the following drawings, in which like numerals refer to like elements, and in which:

FIG. 1 is a side view of a single-walled carbon nanotube;

FIG. 2 is a sectional view of a single-walled carbon nanotube;

FIG. 3 is a sectional view of a multi-walled carbon nanotube;

FIGS. 4A and 4B are views of a preferred electrode;

DESCRIPTION OF THE PREFERRED EMBODIMENTS

Figure 4:
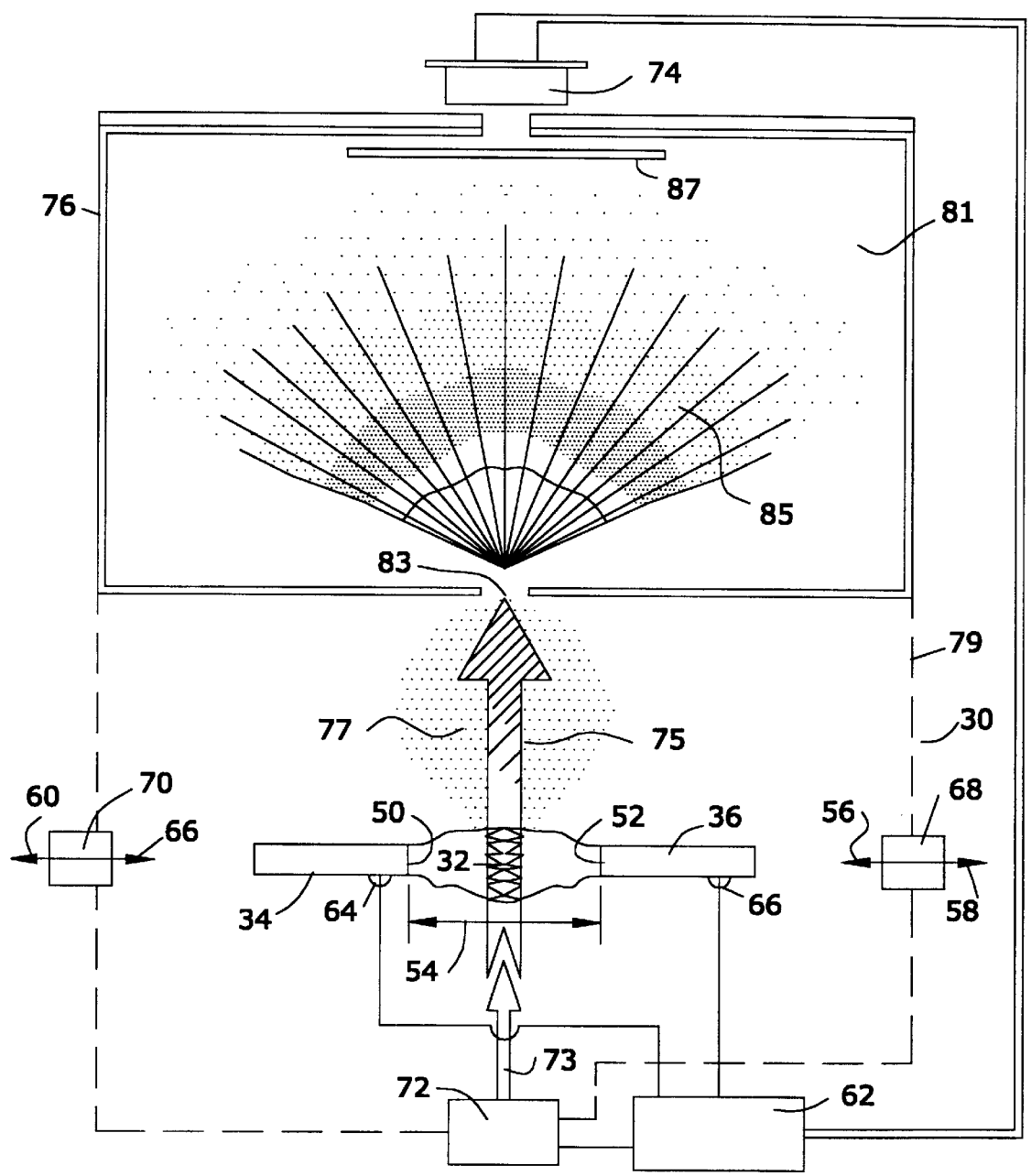
FIG. 4 is a schematic representation of one preferred process for making single-walled carbon nanotubes.

FIG. 1 is a schematic representation of a single-walled nanotube 10 which is not drawn to scale. These nantobues, and their production, are well known in the art. Reference may be had, e.g., to U.S. Pat. No. 6,221,330, which describes a process for producing hollow, single-walled carbon nanotubes by the catalytic decomposition of one or more gaseous carbon compounds. The entire disclosure of this United States patent is hereby incorporated by reference into this specification.

Referring to FIG. 1, it will be seen that the nanotube 10 is comprised of single wall defined by interior surface 12 (shown in dotted line outline) and exterior surface 14.

Typically the nanotube 10 has a length 16 of at least about 0.1 microns and generally from 10 to about 200 microns. The diameter 18 of the nanotube is generally less than 1 micron and, preferably, less than about 0.1 micron. The aspect ratio of nanotube 10, the ratio of its length 16 to its diameter 18, is at least about 5, more preferably at least about 100, and even more preferably at least about 1,000.

The preferred nanotube 10 is preferably substantially, i.e., it contains at least about 99.9 percent and less than about 100 parts per million of contaminant. As used in this specification, the term contaminant refers to any material which is not carbon. As will be apparent, the nanotube produced by the process of this invention is inherently more pure than the nanotubes produced by processes which utilize supported metal catalyst. As is disclosed in U.S. Pat. No. 6,221,330, the use of supported metal catalysis is inherently disadvantageous in that the supported catalyst is necessarily incorporated into the single-walled carbon nanotube formed therefrom. The entire disclosure of this United States patent is hereby incorporated by reference into this specification.

The process described in U.S. Pat. No. 6,221,330 does not incorporate a substantial amount of metal catalyst into its final product. However, the product produced by such process contains a substantial amount of multi-walled carbon nanotube product.

FIG. 2 is a sectional view of the nanotube 10, illustrating that only one wall 20 is formed by the process of this invention. By comparison, FIG. 3 is a sectional view of a multi-walled nanotube 22.

Referring to FIG. 3, a multi-walled nanotube 22 is depicted with two walls 24 and 26. As will be apparent to those skilled in the art, many more such concentric walls are often present in the multi-walled nanotube, often up to about 20 or more of such concentric walls.

The multi-walled nanotube 22 typically contains a multiplicity of walls with different physical, structural, and chemical properties, each of which also may have indeterminate structure and length. The properties of the composite multi-walled structure vary substantially from one nanotube to the other and, thus, these multi-walled nanotubes cannot be used with any degree of predictability in processes requiring finite, reproducible properties.

The process of this invention, without requiring a purification step, preferably produces a yield of at least about 10 weight percent and, more preferably, at least about 50 weight percent.

FIG. 4 is a schematic of one preferred process 30 of the invention. In this process, an area 32 of high temperature is caused to exist between electrodes 34 and 36. It is preferred that area 32 preferably have a temperature in excess of 1,000 degrees Celsius, and preferably in excess of 5,000 degrees Celsius. In one embodiment, the temperature in area 32 is in excess of 10,000 degrees Celsius.

In one embodiment, the gas pressure within area 32 is at least about 100 atmospheres. In one embodiment, the gas pressure within area 32 is at least about 1,000 atmospheres.

In one embodiment, the area 32 is comprised of a high temperature plasma comprised of ions and electrons. Thus, e.g., area 32 is preferably comprised of ionized fullerenes in a concentration of from at least about 0.1 volume percent, by weight of inert gas in the gas mixture.

As is known to those skilled in the art, and as is used in this specification, fullerenes are any of several forms of carbon consisting of atoms joined together as a hollow structure. They are single molecules of carbon containing 30+2n carbon atoms, wherein n is a positive integer, preferably from about 1 to about 1000. In one embodiment, the fullerene molecules contain 60 carbon atoms.

These fullerenes, and their preparation, are well known to those skilled in the art. Reference may be had, e.g., to U.S. Pat. Nos. 5,876,684, 5,575,615, 5,561,102, 5,530,203, 5,275,705, and the like. The entire disclosure of this United States patent is hereby incorporated by reference into this specification.

Referring again to FIG. 1, the plasma within area 32 at least about 10 volume percent of ions and, more preferably, at least about 40 volume percent of ions. In one embodiment, the plasma contains at least about 50 volume percent of ions.

In one embodiment, at least 50 volume percent of the ions in the plasma are fullerene ions.

Referring again to FIG. 1, the electrodes 34 and 36 preferably consist essentially of compressed fullerene material. As used herein, the term "consist essentially" means that at least about 99.9 percent of such electrodes are fullerene.

In another embodiment, not shown, the electrodes 34 and 36 comprise a major amount of carbon-containing material, such as graphite.

In another embodiment, not shown, the electrodes 34 and 36 contain a mixture of fullerene material and metal. A typical electrode 34 that can be used in this manner is illustrated in FIG. 4A.

Referring to FIG. 4A, and in the preferred embodiment depicted therein, the electrode 34 depicted is comprised of a core 40 of metal surrounded by a sheath 42 of compressed carbon and/or fullerene material. This electrode 34 may be made by preparing a carbon nanotube and filling it with molten metal, such as nickel, iron, cobalt, molybdenum and the like.

FIG. 4B is sectional view of an electrode 44 in which the metal sheath 46 encompasses a carbon and/or fullerene core 48.

In one embodiment, not shown, the electrode 34 is a sintered aggregate of carbon/fullerene metal mixed with one or more of the aforementioned metals and thereafter heated to form a homogeneous sintered mass.

Referring again to FIG. 4, and in the preferred embodiment depicted, each of the electrodes 34 and 36 are preferably cylindrically shaped, have a length of from about 8 to 16 inches, and have a diameter of from about 0.1 to about 0.5 inches.

The electrodes 34 and 36 are comprised of ends 50 and 52 which define a gap 54 therebetween. The gap 54 is preferably from about 1 to about 5 millimeters, and more preferably, from about 1 to about 4 millimeters.

During the process 30, it is preferred to maintain gap 54 so that it is substantially constant. This is difficult in that, during such process, the electrodes 34 and 36 are consumed and, thus, their dimensions are changed. In order to maintain a uniform gap, means are provided for moving the electrodes 34 and/or in the direction of arrows 56, 58, 60, and 62.

In the embodiment depicted in FIG. 4, controller 62 is operatively connected to sensors 64 and 66, which are adapted to measure the respective impedances of the electrodes 34 and 36. As will be apparent to those skilled in the art, the impedance of ech of electrodes 34 and 36 will change when its length, and other factors, change. By the use of a programmable computer (not shown) in controller 62, the effect of the change in impedance of any particular electrode 34/26 and its corresponding causative change in length of said electrode is determined. After such determination, controller 62 causes servo drives 68 and 70 to make appropriate adjustments in the gap 54.

The controller 62 is also operatively connected to the gas supply 72 and, thus, can vary the rate of gas flow thereofrom, and/or the pressure of the gas pulses therefrom. The properties of the plasma pulses produced in the process can be measured by sensor 74, which may, e.g., be fast ion gauge. Sensor 74 feeds information back to controller 62 which, depending upon the information received, can vary the pulse rate, the gas pressure, and other parameters.

Referring again to FIG. 4, gas flows from the gas source 72 in the directions of arrows 73 and 75, past the area 32 between the electrodes 34 and 36, and into the quench area 77. The gas flow rate is so regulated that the heated plasma within the electrode area 32 is cooled within a period of less than 2 milliseconds from its temperature in excess of 1,000 degrees Celsius to a temperature of less than 500 degrees Celsius. In one embodiment, the heated plasma is cooled from a temperature of at least about 5,000 degrees Celsius to a temperature of less than 500 degrees Celsius in less than about 1 millisecond.

In the embodiment depicted in FIG. 4, the quench area 77 is at room temperature. In one aspect of this embodiment, the whole process is conducted within a vacuum chamber 79 depicted by in dotted line outline in FIG. 4. The controller 62 and/or the servo drives 68 and 70 may be disposed within such vacuum chamber 79, but they may also be disposed outside of such chamber 79.

In the embodiment depicted in FIG. 4, two vacuum chambers are depicted. The vaccum chamber 79 is indicated by dotted lines; and it houses the arc discharge apparatus. The vacuum chamber 81 is indicated by solid lines, and it houses the harvester/sensor device to described elsewhere in this specification. In the embodiment depicted, the two vacuum chambers 79 and 81 are separated by an orifice 83. In another embodiment, not shown, the two chamber 79 and 81 communicate with each other and form one continuous chamber.

In either event, it is preferred to maintain a vacuum of less than about 1 Torr within chambers 79 and 81 prior to the time the reaction occurs. In one embodiment, the vaccum so maintained is less than about 0.1 Torr and, more preferably, less than about 0.01 Torr. In an even more preferred embodiment, the vacuum so maintained is less than about 0.001 Torr.

After the plasma is heated within area 32, the pressure within such area increases from said pressure of less than about 1 Torr to a pressure of at least 1,000 Torr and, more preferably, at least about 5,000 Torr. The heated plasma, which is at such pressure of at least 5,000 Torr and at a temperature of at least about 1,000 degrees Celsius, then is quickly transformed to a state in which its temperature is less than 500 degrees Celsius and its pressure is less than about 1 Torr; typically this transformation occurs in a period of less than about 10 milliseconds.

In one preferred embodiment, the electrodes 34 and 36 are made from a pressed fullerene material. This pressed fullerene material typically has a density of from about 2 to about 4 grams per cubic centimeter and, more preferably, from about 2 to about 3 grams per cubic centimeter.

The pressed fullerene material preferably has a hardness of from about 10 to about 60 GigaPascals. In one embodiment, the hardness of such pressed fullerene is from about 30 about 45 GigaPascals.

The pressed fullerene material has a resistivity less than 0.1 ohms-cemtimeters and, preferably, less than about 0.01 ohms-centimeters.

The pressed fullerene material preferably has a compressive strength of from about 1 to about 9 GigaPascals.

In one embodiment, pressed fullerene material is made from commercially available soot. It is preferred that the soot used in the process preferably has at least about 98 weight percent of its particles smaller with a diameter in the range of from about 0.7 to about 1.0 nanometers and is comprised of at least about 99 weight percent of carbon. In one embodiment, the soot used preferably is comprised of at least 99 weight percent of fullerene material. To the extent that commercially available soot is not pure enough, it may be purified prior to the time it is agglomerated and hot-pressed.

Soot which contains at least 99 weight percent of fullerene material and has at least 98 percent of its particles smaller than about 1.0 nanometer is available. Reference may be had, e.g., to U.S. Pat. Nos. 5,750,615, 5,558,903, 5,876,684, 6,171,451, 5,660,397, 5,462,680, and the like; the entire disclosure of each of these United States patents is hereby incorporated by reference into this specification.

The properties of fullerene soot have been explored by, e.g., the SRI International Company of 333 Ravenswood Avenue, Menlo Park, Calif.

The starting soot material is then preferably agglomerated prior to the time it is hot pressed to form the electrodes. It is preferred to agglomerate the fine soot particles so that the average particle size of the agglomerated soot is within the range of from about 1 to about 100 microns and, more preferably, from about 1 to about 10 microns. One may agglomerate the soot particles by conventional means.

The soot used in the process, which preferably is fullerene soot with the properties specified hereinabove, is preferably hot pressed in a sintering press at a temperature of from about 300 to about 1,000 degrees Celsius and pressure of from about 1 to 10 GigaPascals for a period of at least 1 second.

In one embodiment, prior to the time the soot is hot pressed into the desired electrode shape, it may be admixed from about 1 to about 10 weight percent (by total weight of catalyst and soot) of metal catalyst. Suitable metal catalysts include, e.g., nickel, cobalt, iron, and the like. These metal catalysts preferably have a particle size distribution such that at least about 90 weight percent of the catalyt particles have a diameter within the range of from about 0.7 to about 1.0 nanometers.

Referring again to FIG. 4, and in one preferred embodiment thereof, it is preferred that one generate a difference of potential of at least about 1,000 volts between electrode the ends 50/52 of electrodes 34 and 36 sufficient to ionize the gas a cause dielectric breakdown thereof. In one embodiment, the difference of potential utilized is from about 1,000 to about 5,000 volts. As will be apparent to those skilled in the art, depending upon the gas used, different voltages will be required.

In one embodiment, the energy provided is in the form of pulsed direct current with a voltage of from about 1,000 to about 5,000 volts and a pulse duration of from about 1 microsecond to about 50 microseconds. The period between adjacent pulses generally is from about 100 to about 1,000 milliseconds. The sequence of pulses/resting periods/pulses is continued until the desired amount of material has been harvested.

Without wishing to be bound to any particular theory, applicants believe that the conditions utilized in their process produce gaseous fullernene ions in the area 32 between electrodes 34 and 36 and that these gaseous fullerene ions, in combination with other materials, facilitate the deposition of single-walled carbon nanotubes.

One may use conventional means for generating the desired differences of potential and coordinating such differences with the gas pulses produced. One preferred means for achieving such end is depicted in FIG. 5.

Figure 5:
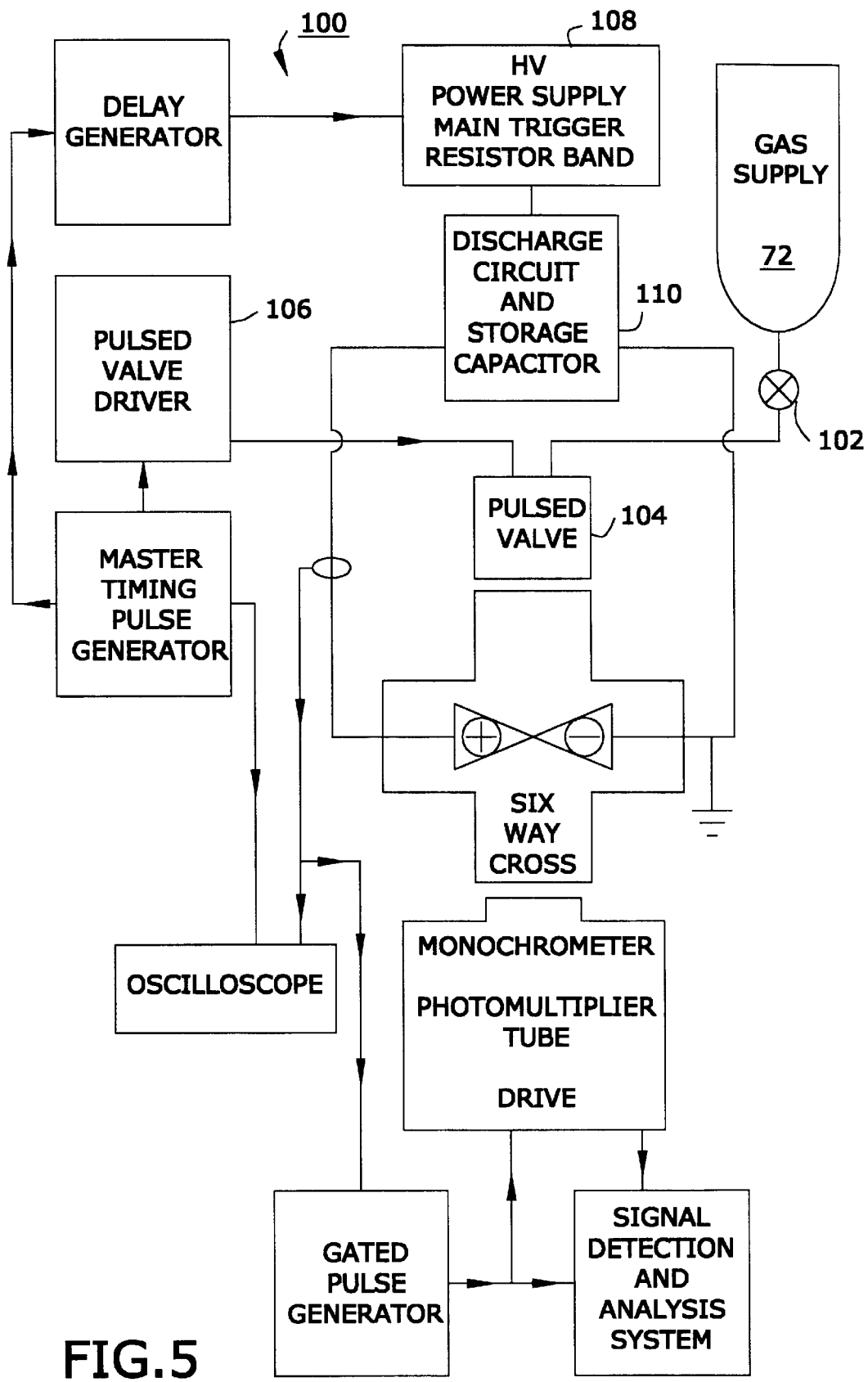
FIG. 5 a flow chart of the process depicted in FIG. 4.

Referring to FIG. 5, the assembly 100 depicted is comprised of gas supply 72 connected to valve 102 and thence to pulsed valve 104. The pulsed valve 104, in response to signals from pulsed valve driver 106, provides pulses of the desired gas to area 32 (see FIG. 4).

In one embodiment, illustrated in FIG. 5, the assembly 100 provides a clean vacuum environment for material deposition, shielding, and containment of electrical discharge. The system 100 is comprised of direct current power supply 108, an energy storage capacitor and discharge circuit 110, and other triggering, timing and safety components needed for operation.

The high voltage direct current power system 108 preferably converts 110 volt alternating current into 1200 volt direct current. A resistor bank is preferably used to limit the charging current of the circuit. The resistor bank preferably has 12,000 ohm resistance to give an RC time constant of 0.25 seconds, which allows for 2 hertz operation. A storage capacitor 110 stores 20.3 microfarards of charge until it is released through a silicon controlled rectifier. The main trigger board is preferably a monostable timer circuit that produces the proper trigger pulse to the capacitor discharge circuit.

The gas used preferably is or comprises an inert gas, such as helium, argon, nitrogen, krypton, xenon, neon, and mixtures thereof. At least about 85 volume percent of the gas will be inert gas.

In one embodiment, the gas used contains both such inert gas and minor amounts of one or more hydrocarbon gases. One may use from about 1 to about 15 volume percent of such hydrocarbon gas(es) and, more preferably, from about 1 to about 10 volume percent of such hydrocarbon gas(es). Suitable hydrocarbon gases include, e.g., methane, ethane, propane, butane, ethylene, acetylene, propylene, and other unsaturated, gaseous hydrocarbons. In general, it is preferred that such gaseous materials contains less than about 5 carbon atoms per molecule.

In one embodiment, in addition to the inert gas(es) and the hydrocarbon gas(es), one may admix from about 0.1 to about 5.0 volume percent of gaseous metal compounds. Suitable catalytic gaseous components include gases of the formula $M(CO)_5$, wherein M is a metal selected from the group consisting of nickel, cobalt, iron, and mixtures thereof.

Referring again to FIG. 4, and in the preferred embodiment depicted therein, the quenched plasma is preferably harvested on a substrate 87. The substrate 87 may be stationary, it may be movable, it may be water cooled, etc.

In one preferred embodiment, the substrate 87 is a material which will facilitate the deposition of single-walled nanotubes. Such materials include, e.g., a water-cooled copper block, a titanium film, an aluminum material, etc.

Figure 6:
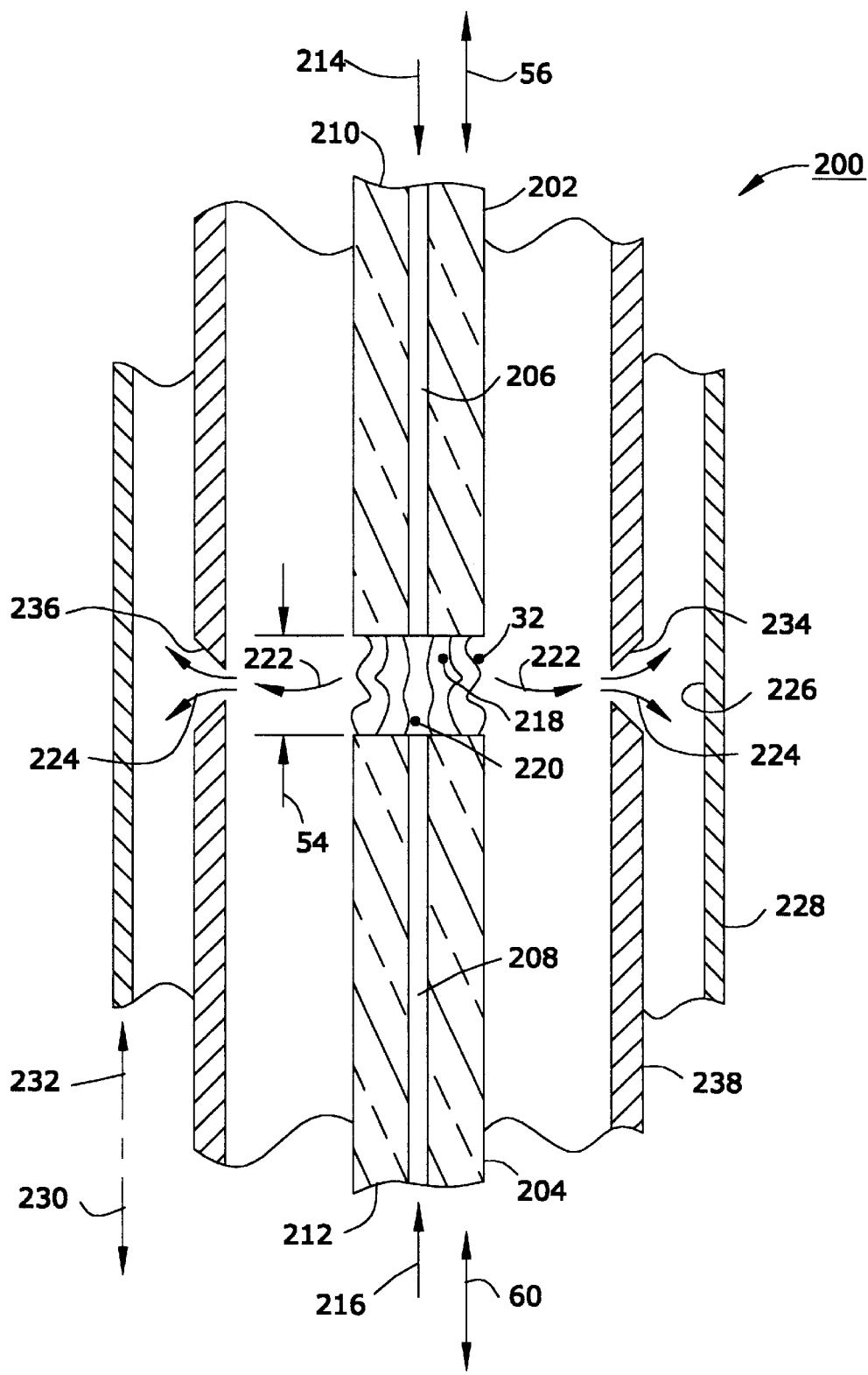
FIG. 6 is a schematic of a process for making alloys or compounds utilizing a pulsed arc discharge.

FIG. 6 is a schematic representation of a process 200 which utilize two electrodes, electrodes 202 and 204. These electrodes 202 and 204 are each comprised of an orifice 206 and 208, respectively, extending from their proximal ends 210 to their distal ends 212. In the manner depicted in FIG. 4, or by a similar manner, the gap 54 between electrodes 210 and 212 can be maintained at a substantially constant and optimal distance.

Referring again to FIG. 6, input gases are fed to the orifices 206/208 in the direction of arrows 214/216. In one embodiment, it is preferred that the input gas fed to orifice 206 differ from the input gas fed to orifice 208. In another embodiment, such gases are the same.

As will be apparent, when different gases are fed to orifices 206 and 208, different reaction products will occur at points 218 and 220. These different moieties can then react with each other within the plasma to form otherwise unattainable compounds, alloys, admixtures, and the like.

In addition to utilizing different gas(es), one may utilize different material(s) for the electrodes 202 and 204 to provide for a large multiplicity of different reaction intermediates and products.

As will be apparent, different portions of the plasma 32 will have different concentrations of ions, elements, compounds, and the like. However by uniformly agitating and mixing the plasma 32, a substantially uniform material may be created.

One means of creating such a substantially uniform material is be controlling the outflow of plasma 32 in the directions of arrows 222 and 224, and coordinating such outflows with input flows 214 and 216, so that, because of the combinations of such flows and the various pressure differentials, substantially uniform mixing and turbulence is created. The means of creating such uniform mixing will be apparent to those in the fluid flow/plasma arts.

In one embodiment, the plasma is harvested on the inside surface 226 of the substrate sleeve 228. In one aspect of this embodiment, substrate sleeve 228 can be moved in the directions of arrows 230 and/or 232, it can be cooled and/or heated, and it can be modified in any manner adapted to facilitate the deposition and/or the adhesion and/or the conversion of the plasma 32.

As will be apparent to those skilled in the art, the relative sizes of pressure vessel 238 and/or substrate sleeve 228 and/or the inside surface 226 of substrate sleeve 228 may me chosen in a manner adapted to facilitate the gradual accumulation of a relatively large thickness of deposited material at specified points in time and/or space. These accumulated material(s) can be periodically removed by conventional means such as, e.g., trap doors, air lock assemblies, and the like, which will not require loss of evacuation within the system and/or termination of the process.

Referring again to FIG. 6, the plasma is allowed to flow through orifices 234 and 236 prior to the time it contacts the substrate sleeve 228. In the embodiment depicted, only one such orifice is shown per side of the plasma chamber. In another embodiment, a multiplicity of such orifices are utilized. In yet another embodiment, the orifice(s) utilized promotes helical flow of the plasma. In one embodiment, the orifice is a continous fine circumferential slit.

In one preferred embodiment, the orifices 234/236 are preferably disposed within a cylindrical pressure vessel 238 that creates an appropriate pressure differential to cause the plasma to expand as it contacts the substrate. This expansion, and the subsequent chilling/cooling of the substrate, tends to facilitate certain reactions and limit others. It is preferred to utilize conditions such that only the most stable compound forms are will be deposited.

Figure 7:
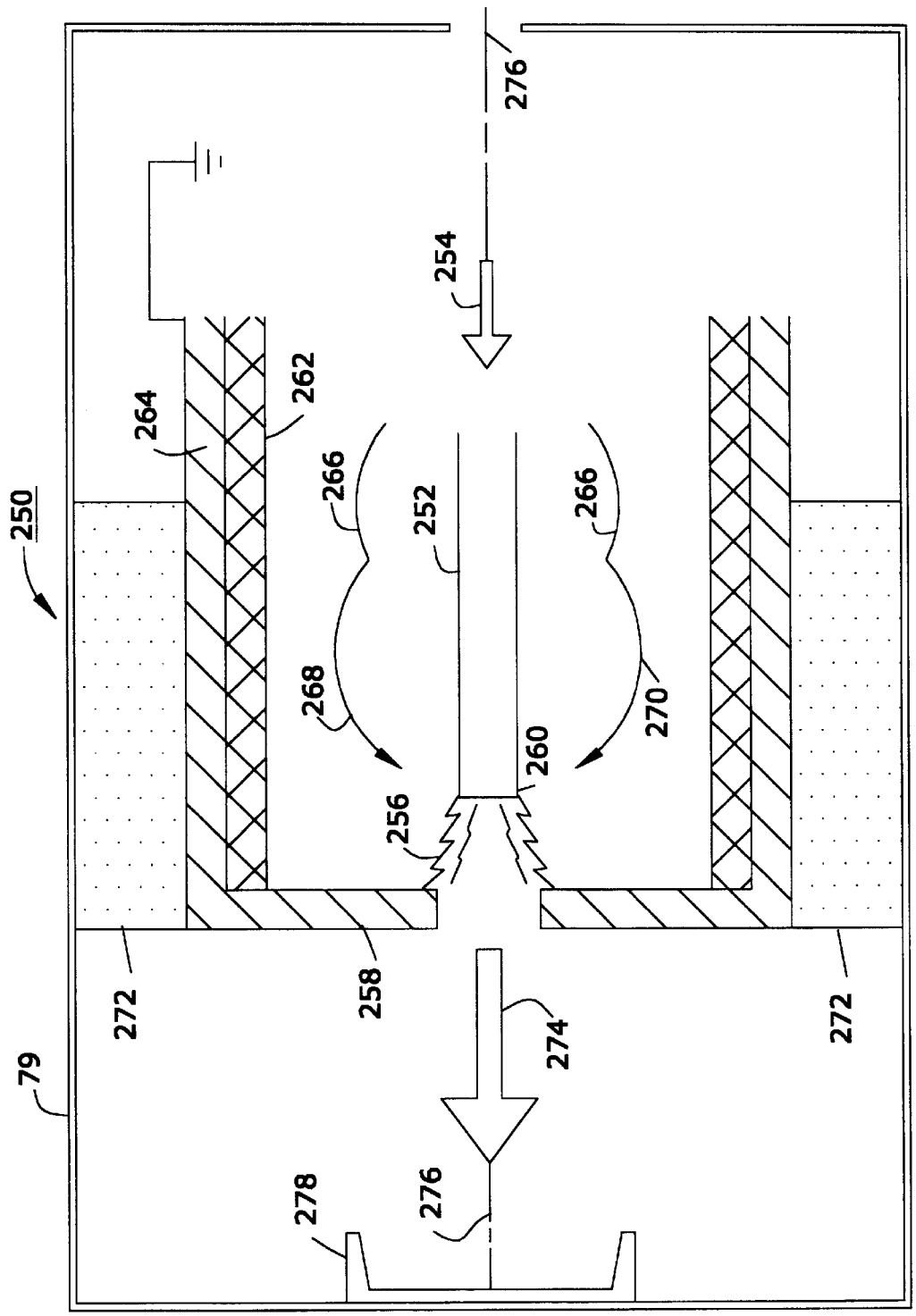
FIG. 7 is schematic of another, continuous process of the invention.

FIG. 7 is a schematic representation of a continuous direct current discharge process 250. In the embodiment depicted, an electrode 252 is preferably comprised of the cold-pressed fullerene material described elsewhere in this specification. It may be moved in the direction of arrow 254 as it is consumed in the discharge 256 in order to maintain a uniform gap between surfaces 258 and 260. This gap preferably should be maintained at from about 1 to about 5 millimeters.

A second stationary electrode, electrode 258, preferably is in the form of a cylindrical shell within which electrode 252 is movably disposed. The electrode 258 preferably consists of a pure, high-temperature metal such as, e.g., tungsten. The metal used should have a melting point in excess of about 1,000 degrees Celsius to prevent its deformation during the discharge process.

In the preferred embodiment depicted in FIG. 7, a cerarmic spacer 262 is disposed on the inside surface of electrode 258. The ceramic spacer 262 prevents a discharge from occurring between the electrode 252 and the inner wall of the metal electrode 258. Other insulating materials with high-temperature resistance may be used instead of ceramic. The insulating material, however, should be able to resist a temperature of at least about 800 degrees Celsius without deformation.

A gas mixture 266 is preferably flowed in the direction of arrows 268 and 270. The gas mixture may be the same as described by reference to FIG. 4; thus, e.g., it may be a mixture of inert gas, hydrocarbon gas, and metal carbonyl.

In one preferred embodiment, the gas 266 if flowed into the shell 258 in a manner to create helical vertical flow.

A power supply (not shown) furnishes sufficient energy to electrode 252 to provide a potential difference sufficient to ionize the gas 266. In one embodiment, a voltage of less than 40 volts and a current of less than 100 amperes is utilized.

In the embodiment depicted in FIG. 7, an electromagnet 272 is disposed around the system focus the plasma beam 274 upon central axis 276. This electromagnet may be created and maintained, e.g., by a direct current of less than 100 amperes and less than 12 volts.

The focused plasma 274 may be continually harvested on substrate 278; and the material so harvested may be continuously or periodically removed.

In the embodiment depicted, the assembly is disposed within a vacuum chamber 79 whose vacuum properties are described elsewhere in this specification.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

We claim:

1. A process for preparing a material, comprising the steps of:

(a) subjecting a gas mixture to a temperature of at least 1,000 degrees Celsius, while simultaneously increasing the pressure of said gas mixture to a pressure of at least 1,000 Torr, thereby producing a hot gas mixture, wherein said gas mixture is comprised of at least about 85 volume percent of inert gas, and at least about 0.1 volume percent of ionized fullerene material, (b) decreasing the temperature of said hot gas mixture to a temperature of less than 500 degrees Celsius in a period of less than about 1 millisecond, and (c) decreasing the pressure of said hot gas mixture from said pressure of at least about 1,000 Torr to a pressure of less than about 1 Torr in a period of less than about 10 milliseconds.

2. The process as recited in claim 1, comprising the step of disposing said hot gas mixture between a first electrode and a second electrode, and wherein a difference of potential of a least 1,000 volts is established between said first electrode and said second electrode.

3. The process as recited in claim 2, comprising the step of ionizing fullerene material while forming it into gaseous fullerene material disposed between said first electrode and said second electrode.

4. The process as recited in claim 3, comprising the step of establishing a first electrical pulse between said first electrode and said second electrode.

5. The process as recited in claim 4, wherein said first electrical pulse has a duration of from about 1 microsecond to about 50 microseconds.

6. The process as recited in claim 5, comprising the step of establishing a second electrical pulse between said first electrode and said second electrode.

7. The process as recited in claim 6, wherein said second electrical pulse has a duration of from about 1 microsecond to about 50 microseconds.

8. The process as recited in claim 7, comprising the step of delaying the introduction of said second electrical pulse after said first electrical pulse has terminated.

9. The process as recited in claim 8, wherein said second electrical pulse is established after from about 100 to about 1,000 milliseconds from the termination of said first electrical pulse.

10. The process as recited in claim 9, wherein each of said first electrode and said second electrode is comprised of compressed fullerene material.

11. The process as recited in claim 10, wherein each of said first electrode and said second electrode is comprised of a core of metal surrounded by a sheath of said compressed fullerene material.

12. The process as recited in claim 11, said compressed fullerene material has a density of from about 2 to about 4 grams per cubic centimeter, a resistivity of less than about 0.1 ohm-centimeters, and hardness of from about 10 to about 60 GigaPascals.

13. The process as recited in claim 2, wherein each of said first electrode and said second electrode is a hollow electrode, and wherein gas is flowed through the center of said first electrode and said second electrode.

14. The process as recited in claim 2, comprising the step of maintaining a continuous direct current discharge between said first electrode and said second electrode.

15. The process as recited in claim 14, comprising the step of disposing said first electrode and said second electrode within an electromagnet.

16. The process as recited in claim 1, wherein said hot gas mixture is comprised of from about 1 to about 15 volume percent of hydrocarbon gas.

17. The process as recited in claim 16, wherein said hot gas mixture is comprised of from about 0.1 to about 5 volume percent, by volume of said inert gas, of gaseous metal compound.

18. The process as recited in claim 17, wherein said gaseous metal compound is of the formula $M(CO)_5$, wherein M is a metal selected from the group consisting of nickel, cobalt, iron, and mixtures thereof.

19. The process as recited in claim 16, wherein said hydrocarbon gas is selected from the group consisting of methane, ethane, propane, butane, ethylene, acetylene, propylene, and mixtures thereof.

20. The process as recited in claim 1, wherein said process is conducted within a vacuum chamber.

* * * * *